US009812568B2

(12) United States Patent
Cho et al.

(10) Patent No.: US 9,812,568 B2
(45) Date of Patent: Nov. 7, 2017

(54) IONIC BARRISTOR

(71) Applicant: BOARD OF REGENTS, THE UNIVERSITY OF TEXAS SYSTEM, Austin, TX (US)

(72) Inventors: Kyeongjae Cho, Frisco, TX (US); Yifan Nie, Dallas, TX (US); Suklyun Hong, Plano, TX (US); Robert M. Wallace, Garland, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 15/015,875

(22) Filed: Feb. 4, 2016

(65) Prior Publication Data

US 2017/0229576 A1  Aug. 10, 2017

(51) Int. Cl.
| | |
|---|---|
| H01L 29/78 | (2006.01) |
| H01L 29/786 | (2006.01) |
| H01L 29/45 | (2006.01) |
| H01L 29/165 | (2006.01) |
| H01L 29/16 | (2006.01) |
| H03K 17/687 | (2006.01) |

(52) U.S. Cl.
CPC ........ *H01L 29/7839* (2013.01); *H01L 29/165* (2013.01); *H01L 29/1606* (2013.01); *H01L 29/45* (2013.01); *H01L 29/78684* (2013.01); *H01L 29/78696* (2013.01); *H03K 17/687* (2013.01)

(58) Field of Classification Search
CPC ............ H01L 29/7839; H01L 29/1606; H01L 29/165; H01L 29/45
See application file for complete search history.

(56) References Cited

U.S. PATENT DOCUMENTS

| | | | |
|---|---|---|---|
| 2011/0147802 A1* | 6/2011 | Colli | B82Y 10/00 257/253 |
| 2012/0193610 A1* | 8/2012 | Kim | B82Y 30/00 257/26 |
| 2013/0025662 A1* | 1/2013 | Afzali-Ardakani | H01B 1/04 136/256 |
| 2014/0057393 A1* | 2/2014 | Bonart | H01L 25/50 438/113 |
| 2016/0284811 A1* | 9/2016 | Yu | H01L 29/454 |

OTHER PUBLICATIONS

Yang, Heejun, et al. "Graphene Barristor, a Triode Device with a Gate-Controlled Schottky Barrier"; Science Magazine, vol. 336, Issue 6085, pp. 1140-1143; (2012).

* cited by examiner

*Primary Examiner* — Matthew Reames
(74) *Attorney, Agent, or Firm* — Talem IP Law, LLP

(57) ABSTRACT

A Schottky barrier device is provided herein that includes a TMD layer on a substrate, a graphene layer on the TMD layer, an electrolyte layer on the TMD layer, and a source gate contact on the electrolyte layer. A drain contact can be provided on the TMD layer and a source contact can be provided on the graphene layer. As ionic gating from the source gate contact and electrolyte layer is used to adjust the Schottky barrier height this Schottky barrier device can be referred to as an ionic control barrier transistor or "ionic barristor".

20 Claims, 11 Drawing Sheets

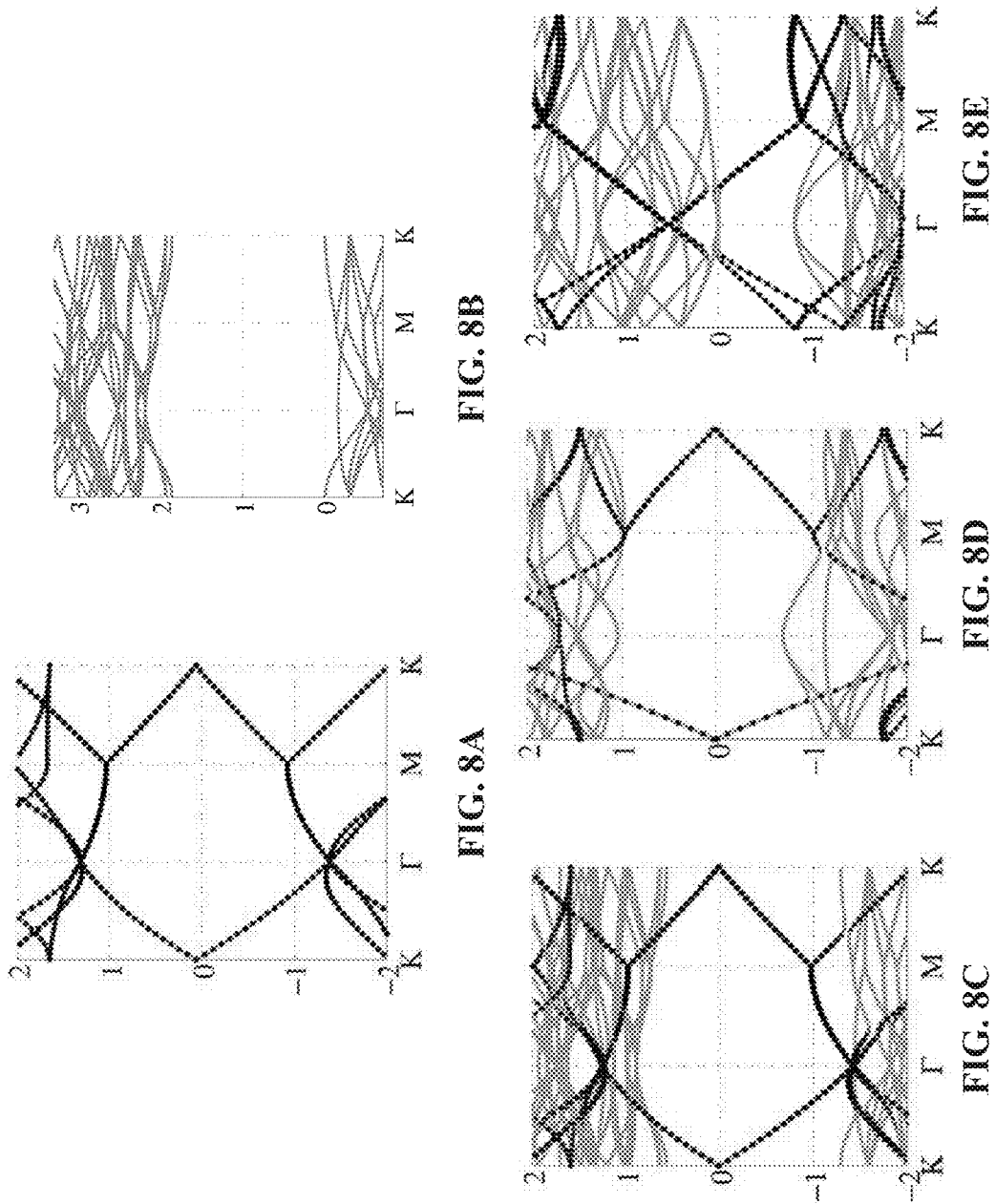

US 9,812,568 B2

IONIC BARRISTOR

This invention was made with government support under Contract No. HR0011-13-3-0002 awarded by the Defense Advanced Research Projects Agency (DARPA). The U.S. Government has certain rights in the invention.

BACKGROUND

Transition-metal dichalcogenides (TMDs) have been extensively researched due to their outstanding mechanical and electrical properties and show great potential in transistor engineering. However, studies have found that real device behaviors are far inferior to the theoretical expectation. One major limiting aspect of device performance occurs at the contact between metal and TMD layers in a transistor, and the smaller the size of the device, the more significant role the contact plays. Problems such as high contact resistance and inability to establish p-type contact between the metal and TMD layer hinder successful device implementation.

BRIEF SUMMARY

A Schottky barrier device is provided herein that includes a TMD layer on a substrate, a graphene layer on the TMD layer, an electrolyte layer on the graphene layer, and a source gate contact on the electrolyte layer. A drain contact can be provided on the TMD layer and a source contact can be provided on the graphene layer. As ionic gating from the source gate contact and electrolyte layer is used to adjust the Schottky barrier height this Schottky barrier device can be referred to as an ionic control barrier transistor or "ionic barristor".

Apart from fabrication and material imperfection reasons, the high contact resistance and difficulty in establishing p-type contacts between metal and TMD layers has been found to be due to partial Fermi level pinning, which pins the work function of metals to the gap states of TMDs induced by metal-TMD interaction. Advantageously, the described Schottky barrier device structure exhibits no partial Fermi level pinning is described herein.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

FIG. 1A shows a cross-section view a Schottky barrier device structure; and FIG. 1B shows an example perspective view of the Schottky barrier device structure with source and drain contacts.

FIG. 3A represents an 'off' condition; and FIG. 3B represents an 'on' condition.

FIG. 4A shows a perspective view, FIG. 4B shows a cross-section view, and FIG. 4C shows a representational schematic.

FIG. 5A illustrates a supercell of graphene on a TMD layer; FIG. 5B illustrates the supercell of FIG. 5A with $PF_6$-on the graphene; and FIG. 5C illustrates the supercell of FIG. 5A with Li ions on the graphene.

FIG. 7A represents the change of band offset for graphene and $MoS_2$; and FIG. 7B represents the change of band offset for graphene and $WSe_2$.

FIGS. 8A-8E show detailed band structures of the graphene and TMD layers. FIG. 8A shows the band structure of a monolayer graphene; FIG. 8B shows the band structure of a monolayer $MoS_2$; FIG. 8C shows the band structure of a unit cell of graphene in contact with $MoS_2$; FIG. 8D shows the band structure of a unit cell of graphene in contact with $WSe_2$; and FIG. 8E shows the band structure of graphene in contact with $ZrS_2$.

FIG. 9A shows the energy diagram for $MoS_2$ as the TMD; FIG. 9B shows the energy diagram for $WSe_2$ as the TMD; and FIG. 9C shows the energy diagram for $ZrS_2$ as the TMD.

FIG. 11A shows the band structure of Li-doped graphene on $MoS_2$; FIG. 11B shows the band structure of $PF_6$-doped graphene on $MoS_2$; FIG. 11C show the band structure of Li-doped graphene on $WSe_2$; and FIG. 11D shows the band structure of and $PF_6$-doped graphene on $WSe_2$.

DETAILED DISCLOSURE

An ionic control barrier transistor (ionic barristor) is described herein. The ionic barristor avoids the partial Fermi level pinning typically caused by the natural behaviors of metal-TMD interfaces. As a brief background, Fermi level pinning occurs when charge transfer and chemical bonding at the interface of a metal and TMD result in metal work function modification and interface gap states formation. The high reactivity of the dangling bonds on the metal surface causes strong overlapping and hybridization between states of chalcogen (from the TMD) and metal atoms on the surface, resulting in semicovalent or covalent bonds between them. This can be a significant problem because the Fermi level pinning causes high contact resistance and inability to establish p-type contact between the metal and TMD layer.

One promising material to use as a substitution for metal is graphene, which possesses semi-metallic electrical properties and molecular mechanical properties. Graphene is a two-dimensional (2D) material which has strong bonding in only two dimensions and behaves similarly to TMDs. Research in this area indicates that graphene may provide a more compatible, less reactive, interface with TMD compared to metal due to an absence of interlayer dangling bonds found in metals. This may result in a high interface quality. In addition, with the absence of strong interactions on the interface, the Fermi level of graphene is not modified by contact with TMD and thus, partial Fermi level pinning will not occur. It was observed that, since the work function of graphene is above the conduction band edge of group IV TMDs, such as $ZrS_2$, an n-type ohmic contact is obtained at the graphene-$ZrS_2$ contact. Since the Fermi level of graphene lies in the middle band gap of both $MoS_2$ and $WSe_2$, a Schottky contact will form when the graphene approaches either $MoS_2$ or $WSe_2$.

The ionic barristor makes use of the Schottky contact that can form between graphene and TMD. Traditional Schottky field effect transistors (FETs) fix the Schottky barrier height. Traditional Schottky FETS function by tuning the thickness of the Schottky barrier and, hence, control tunneling current. In contrast, barristors (triode devices with gate-controlled Schottky barriers) change the Schottky barrier height to achieve logic function. Graphene is particularly useful in barristor device design because it has a far lower density of states compared to metals. The lower density of states allows the work function to be very susceptible to a wide variety of tuning methods, including, but not limited to, using electrostatic field effect or polarizing of ionic fluid.

Figure 1A:
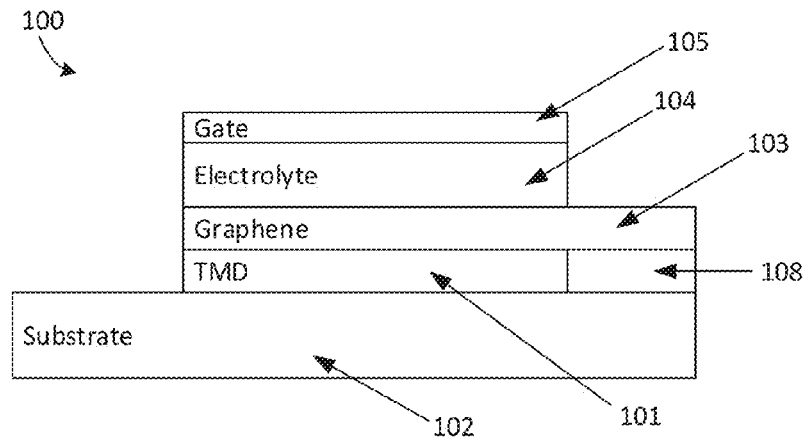
FIGS. 1A and 1B show an example device structure of an ionic barristor.
Figure 1B:
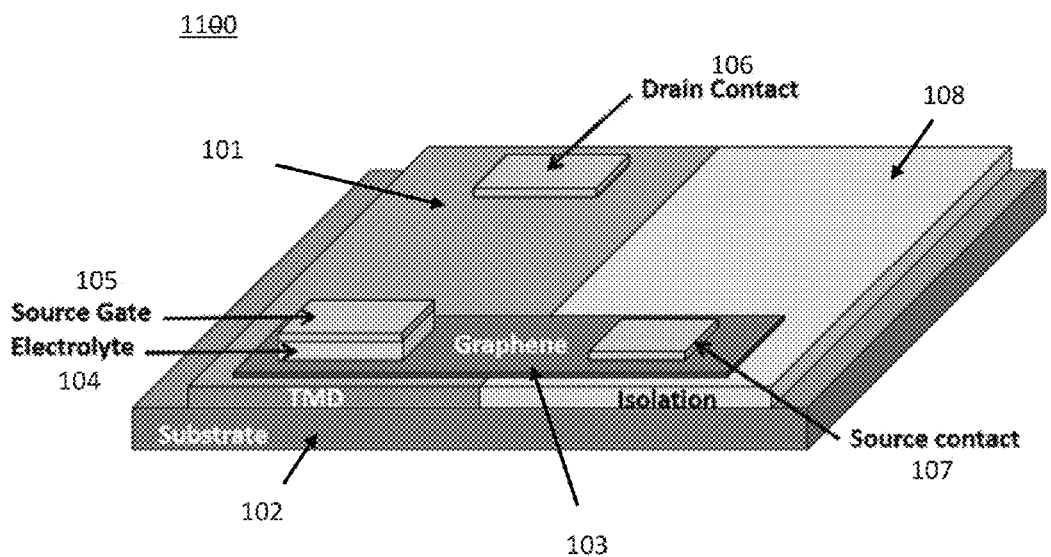

FIGS. 1A and 1B show an example device structure of an ionic barristor. FIG. 1A shows a cross-section view of a Schottky barrier device structure; and FIG. 1B shows an example perspective view of the Schottky barrier device structure with source and drain contacts. Referring to FIG. 1A, a Schottky barrier device structure 100 includes a TMD layer 101 on a substrate 102; a graphene layer 103 on the TMD layer 101; and a solid electrolyte 104 with a source gate contact electrode 105 on the graphene layer 103.

The substrate 102 can be any suitable substrate, depending upon the device operation. Examples include, but are not limited to semiconductors such as silicon (Si), germanium (Ge), $In_xGa_{(1-x)}As$, and $Al_xGa_{(1-x)}N$, where x may range from 0≤x≤1 so as to yield semiconducting properties. Insulating substrates may also be used including, but not limited to, $SiO_2$, sapphire, or other high-k dielectric layers such as $HfO_2$ and $ZrO_2$ rendered on a substrate, AlN, AlGaAs, or other suitable insulators. The TMD layer 101 can include $ZrS_2$, $MoS_2$, $WSe_2$, or combinations thereof. Of course, other TMD materials can be used, such as, but not limited to, $WS_2$, $MoSe_2$, or $MoTe_2$, depending on suitability for a particular application. Although reference is made to "a layer" of TMD (or other material), it should be understood that more than one atomic or molecular layers may be involved unless, of course, the layer is explicitly referred to as a single layer. The TMD can be deposited in a single layer or in a few layers (e.g., 5 or fewer) to accommodate process margin. In most cases, a single layer or bilayer of TMD and a single layer of carbon (for graphene) are used for the devices described herein.

In some cases, the Schottky barrier device structure can form a standalone ionic barristor 110 as shown in FIG. 1B. For the standalone ionic barristor 110, a drain contact electrode 106 is provided on the TMD layer 101, and a source contact electrode 107 is provided on the graphene layer 103. The source contact electrode 107 (on the graphene layer 103) can be isolated from the TMD layer 102 by an isolation material layer 108 on the substrate 102 between the substrate 102 and the graphene layer 103.

The electrolyte 104, which is provided directly on the graphene layer 103, comprises dopant ions. In one implementation, the dopant ions include $Li^+$ atoms. In another implementation, the dopant ions include $PF_6^-$ groups. In yet another implementation, both $Li^+$ and $PF_6^-$ are included in the electrolyte 104, for example as $LiPF_6$. The dopant ions of the electrolyte 104 are used to induce a change in the work function of the graphene layer 103. In particular, the dopants such as, but not limited to, $Li^+$ and $PF_6^-$ can be used to tune the work function of graphene up and down to a wide margin without bringing substantial change to graphene's band structure. This wide range tunability enables graphene to establish both n-type and p-type ohmic contacts with a wide variety of semiconductors through ion adsorption from the electrolyte 104.

Advantageously, unlike implantation, ion adsorption is reversible. This indicates that the tuning of the work function of graphene can be performed reversibly, repetitively, and controlled dynamically. By exploiting the reversible nature of ionic adsorption and desorption, one side of graphene 103 is used to form a high quality contact with TMD 101, and the other side of the graphene 103 is used to reversibly tune the work function of the graphene 103 to establish and break ohmic contact, and thereby realize logic functionality. This dynamic tuning can be explained with reference to FIG. 2 and FIGS. 3A and 3B.

Figure 2:
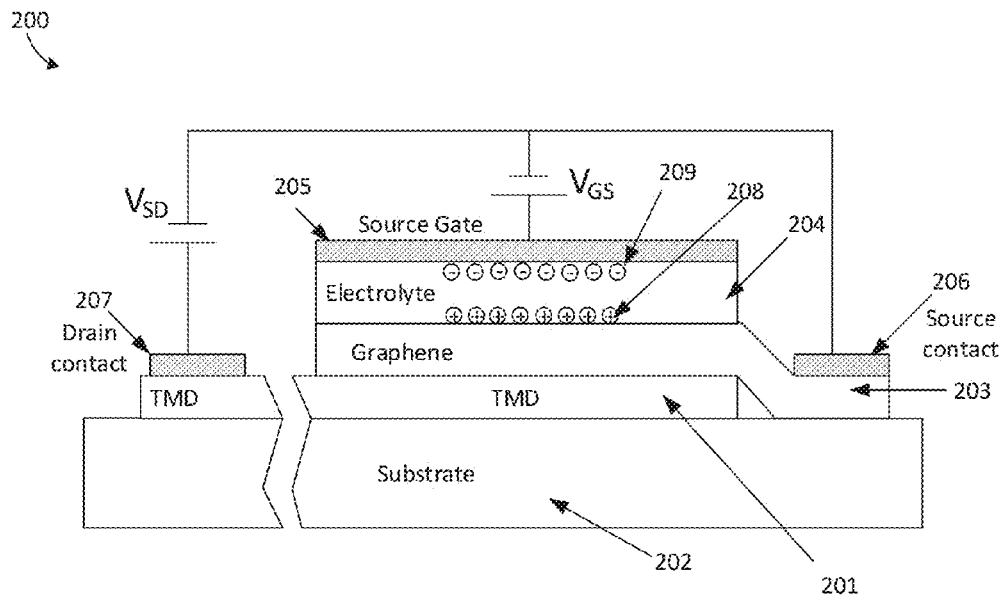
FIG. 2 shows a representational schematic for operating an ionic barristor according to an example implementation.
Figures 3A, 3B:
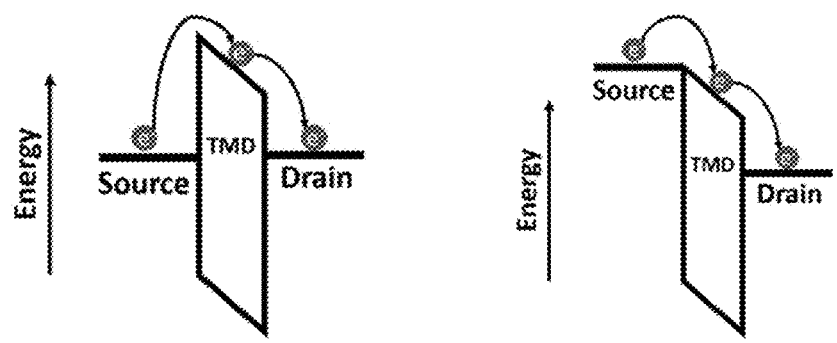
FIGS. 3A and 3B show potential energy diagrams for an electron-injecting type ionic barristor.

FIG. 2 shows a representational schematic for operating an ionic barristor according to an example implementation; and FIGS. 3A and 3B show potential energy diagrams for an electron-injecting type ionic barristor. In FIG. 2, the circuit connections of an ionic barristor 200 are illustrated. As with the ionic barristor shown in FIG. 1B, the ionic barristor 200 includes a TMD 201 on a substrate 202; graphene 203 on the TMD 201; electrolyte 204 on the graphene 203; a source gate 205 on the electrolyte 204; a source contact 206 on the graphene 203; and a drain contact 207 on the TMD 201. As an example implementation, the TMD 201 can be $WSe_2$, and the electrolyte 204 can be a solid or liquid and include $Li^+$ ions 208 and $PF_6^-$ ions 209. A gate voltage $V_{GS}$ can be applied to the source gate 205 and a drain voltage $V_{SD}$ can be applied to the drain contact 207, with the source contact 206 connected to ground.

Referring to FIG. 3A, in the 'off' condition, the Schottky barrier between the conduction band edge of TMD and Fermi level of graphene is high, stopping electrons from tunneling through from the source to the drain. One side of graphene 203 forms an ideal contact with TMD 201, leaving no Fermi level pinning, and the other side is in contact with solid or liquid electrolyte 204 with $Li^+$ ions 208 and $PF_6^-$ ions 209. By changing the gate-source voltage ($V_{GS}$), cations or anions in the electrolyte can adsorb to or desorb from graphene 203, changing the work function of graphene 203 with a margin as much as over ±1 eV. The complete ohmic contact will result in a high on/off ratio.

The on/off switching is realized by the gate-source voltage applied at the source gate 205. The gate-source voltage controls the carrier injection. In the 'off' condition, $V_{GS}$ is not applied, and the high Schottky barrier between graphene 203 and the TMD 201 can effectively stop the carrier (in this embodiment, electrons) injection into the TMD 201, as shown in FIG. 3A. In the 'on' condition, a switching $V_{GS}$ in the range of 1-4V is applied, causing $Li^+$ ions to diffuse and accumulate near the graphene 203. As a result, the work function of the graphene 203 in the source contact 201 is aligned to the conduction band edge of the TMD 201, and electrons are easily injected into the conduction band of the TMD 201, and then drift due to the field induced by the source-drain voltage ($V_{SD}$), as illustrated in FIG. 3B.

In more detail, FIG. 3A shows the 'off' condition, where the injection of electrons is hindered by the high Schottky barrier at the source contact 206. Likewise, FIG. 3B shows the 'on' condition, where the work function of the source contact 206 is tuned by the ions to form ohmic contact with TMD 201, enabling current to flow from source to drain. Switching operation can be carried out by application of $V_{GS}$. An initial state of an 'off' condition can begin with $V_{GS}=0$. To turn the device 'on' and enable current to flow, a voltage in the range of 1 V to 4 V is applied. The actual voltage can be selected to satisfy switching conditions (including time and voltage) for the system that the device is implemented within as well as conditions needed to establish ion accumulation (which may be due to the materials, time, and available voltage).

The current flowing through the channel of the TMD layer may slowly cause the accumulated ions to desorb, resulting in a drift of the ion concentration near the graphene. To address this possible desorption effect, a low set voltage in the 'on' condition may be applied to compensate for the drift (and maintain the concentration of ions near the graphene). To return the device to the 'off' state, an 'off' switching voltage, approximately equal to the 'on' switching voltage with opposite bias (e.g., an 'off' switching voltage of −1 V to −4 V) can be applied. The 'off' switching voltage is used to cause a reduction in the concentration of ions near the graphene.

Figure 4A:
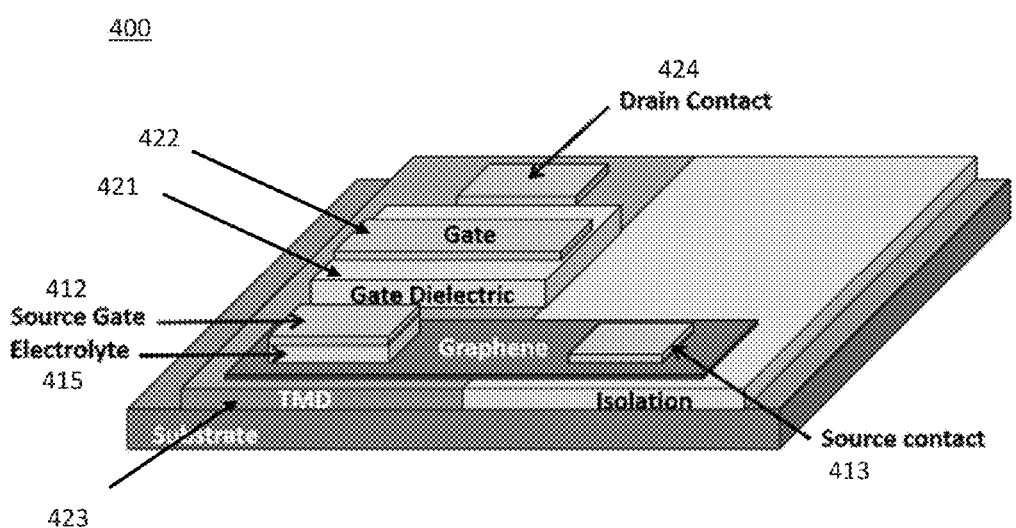
FIGS. 4A-4C show an example device structure of an integrated tunneling field effect transistor (TFET) device with an ionic barristor as a contact enhancement according to an example implementation.
Figure 4B:
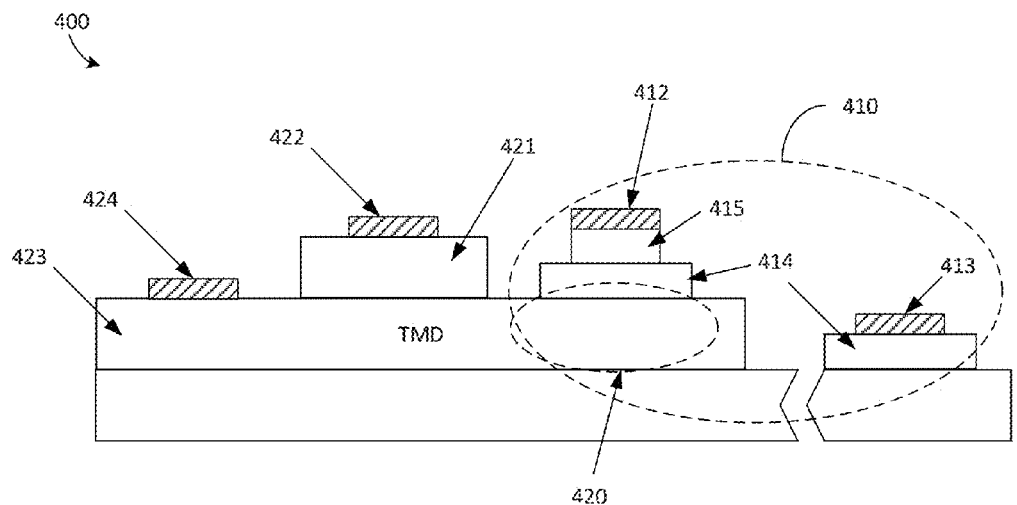
Figure 4C:
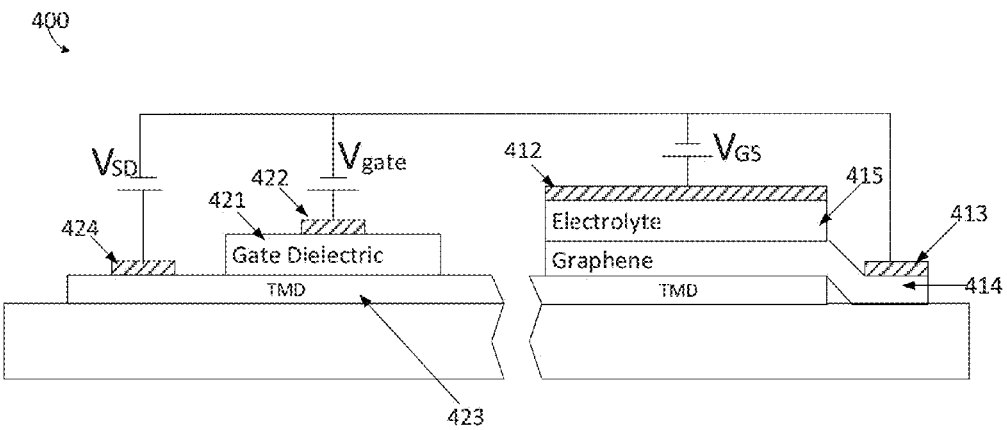

In addition to the single ionic barristor configuration shown in FIG. 1B, the ionic barristor can form a part of other devices, such as the example shown in FIGS. 4A-4C. FIGS. 4A-4C show an example device structure of an integrated tunneling field effect transistor (TFET) device with an ionic barristor as a contact enhancement according to an example implementation. FIG. 4A shows a perspective view, FIG. 4B shows a cross-section view, and FIG. 4C shows a representational schematic. In this design of an enhanced TFET device 400, an ionic barristor 410 is integrated at the source site 420 of a TFET device. In particular, a TMD-based TFET structure includes a gate dielectric 421 with a gate electrode 422 on a TMD layer 423, and a drain contact 424 on the TMD layer 423. Instead of a simple source contact, at a source site 420, an ionic barristor 410 is included.

The logic functionality is realized by the gate voltage (Vgate) of the TFET, as shown in FIG. 4C, which is the same functionality as traditional TFETs. However, faster switching speed is possible by improving the ohmic contact to the TMD layer 423 using the ionic barristor 410. In operation, the gate-source voltage ($V_{GS}$) of the ionic barristor 410, applied to the source gate contact electrode 412, is set static in the 'on' condition (e.g., by application of a voltage such as 1 V-4V), thus establishing an ohmic contact between the graphene source contact electrode 413 and the TMD 423, promoting (in this embodiment, electrons) injection. In this design, a switch 'on' voltage is required to establish ion accumulation in the graphene 414 from the electrolyte 415 before the device starts up, and afterwards a set voltage can be used to compensate for the effect of the source-drain current as explained above. The integration of the devices results in a faster switching speed than the standalone ionic barristor since the logic functionality of the TFET is realized when the gate-source voltage set static.

EXPERIMENTAL EXAMPLES

For the simulation experiments, the density functional theory (DFT) was used to study the contact behavior of graphene and TMD. DFT calculations were performed by Vienna ab—initio Simulation Package (VASP) with the projector-augmented wave (PAW) method. The local density approximation (LDA) was used to describe the exchange-correlation functional with the partial core correction included. Spin polarization and spin-orbit coupling were applied. The wave functions were expanded in plane waves with a kinetic energy cutoff of 500 eV, and the convergence criteria for the electronic and ionic relaxation were $10^{-4}$ eV and 0.05 eV/Å, respectively. Integration over the Brillouin zone was performed with a gamma-centered 6×6×1 Monkhorst-Pack k-point meshes for ionic and electronic optimization. A vacuum region of about 25 Å normal to the surface was added to minimize the interaction between adjacent slabs. The LDA was found to be appropriate for studying the metal-TMD contact. The generalized gradient approximation (GGA) with the DFT-D2 method for van der Waals (vdW) corrections was also used to cross-check the structural accuracy and overall trends, to find that GGA results with vdW corrections were in overall agreement with LDA results.

Figure 5A:
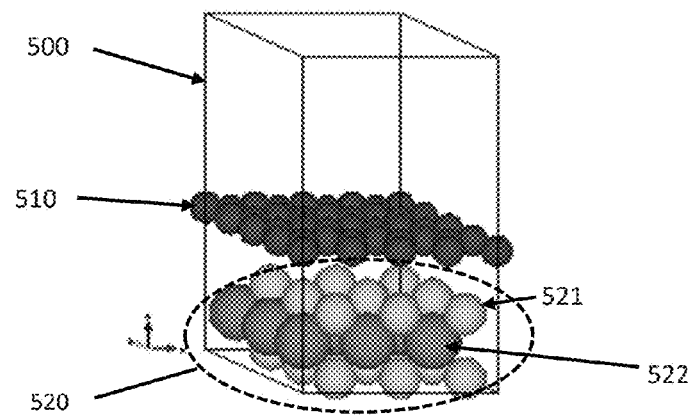
FIGS. 5A-5C show super cell structure representations of the graphene and TMD materials for an ionic barristor.
Figure 5B:
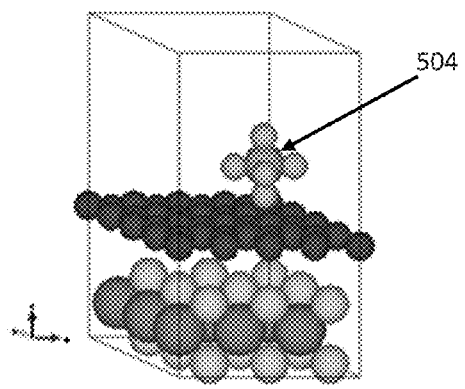
Figure 5C:
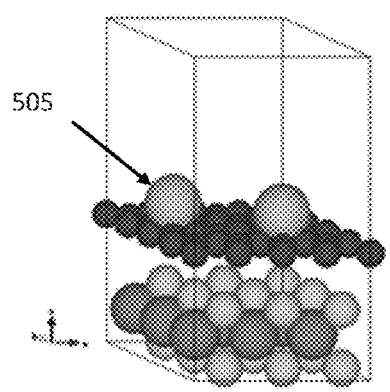

FIGS. 5A-5C show supercell structure representations of the graphene and TMD materials for an ionic barristor. FIG. 5A illustrates a supercell of graphene on a TMD layer; FIG. 5B illustrates the supercell of FIG. 5A with $PF_6$ on the graphene; and FIG. 5C illustrates the supercell of FIG. 5A with Li ions on the graphene.

The stable phase of $MoS_2$ and $WSe_2$ are 2H, and the stable phase for $ZrS_2$ is 1T. Mismatch on lattice constants exist between graphene and TMD. In order to fit the two layers into one super cell such as shown in FIG. 5A, graphene was strained to match the optimized lattice constant of the TMDs ($MoS_2$, $WSe_2$ and $ZrS_2$). For example, as shown in FIG. 5A, a supercell 500 was modeled for graphene 510 (formed of C atoms) on $MoS_2$ 520 (which is formed of S atoms 521 and Mo atoms 522). FIG. 5B shows the supercell with $PF_6^-$ ion 504 and FIG. 5C shows Li ions 505.

Figure 6:
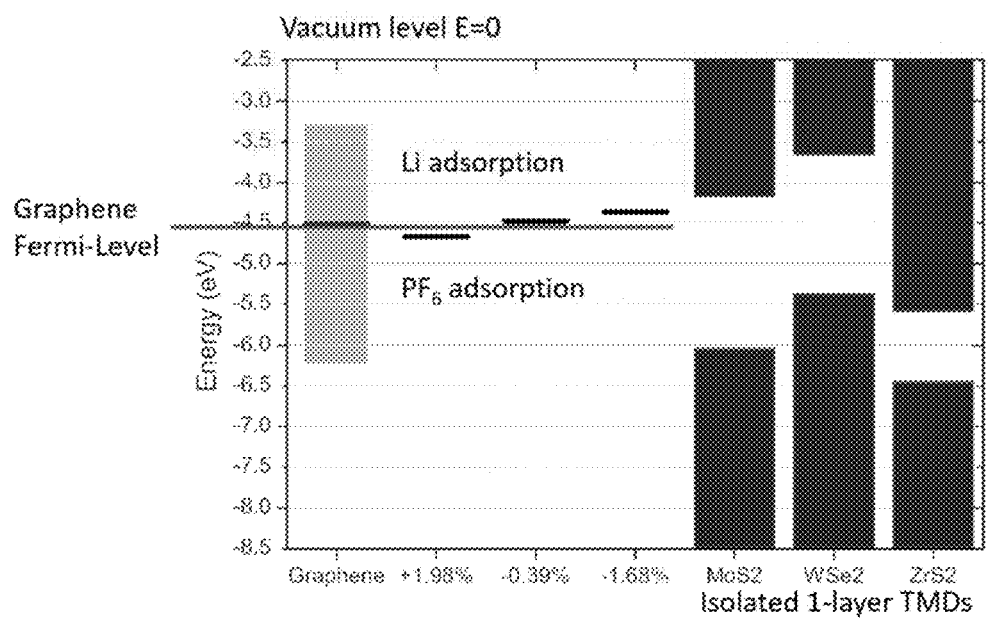
FIG. 6 shows band diagrams of graphene, illustrating Fermi level before and after strain, and the valence and conduction band edges of isolated 1-layer TMDs.

The optimized planar lattice constant for $MoS_2$, $WSe_2$ and $ZrS_2$ are 3.12 Å, 3.25 Å and 3.61 Å, respectively. The optimized planar lattice constant for monolayer graphene is 2.45 Å. In the supercell, the unit cells of TMD and graphene are duplicated by different factors to roughly reach their least common multiple, which agrees well with observed behavior. Strain was induced in graphene to finely match the lattice constants since the electronic behaviors of TMD are very susceptible to lattice strain. The maximum strain induced into graphene was 2%. The electronic behaviors of graphene under this condition were examined. FIG. 6 shows band diagrams of graphene, illustrating Fermi level before and after strain, and the valence and conduction band edges of isolated 1-layer TMDs.

The work function of graphene shifts within ~±0.15 eV after strain. Electron affinity and ionization energy vary within the same margin. Both the LDA method and the GGA+vdW method resulted in similar structure with a distance of ~3.5 Å between graphene and TMD, indicating an interaction of secondary bond nature.

Figure 7A:
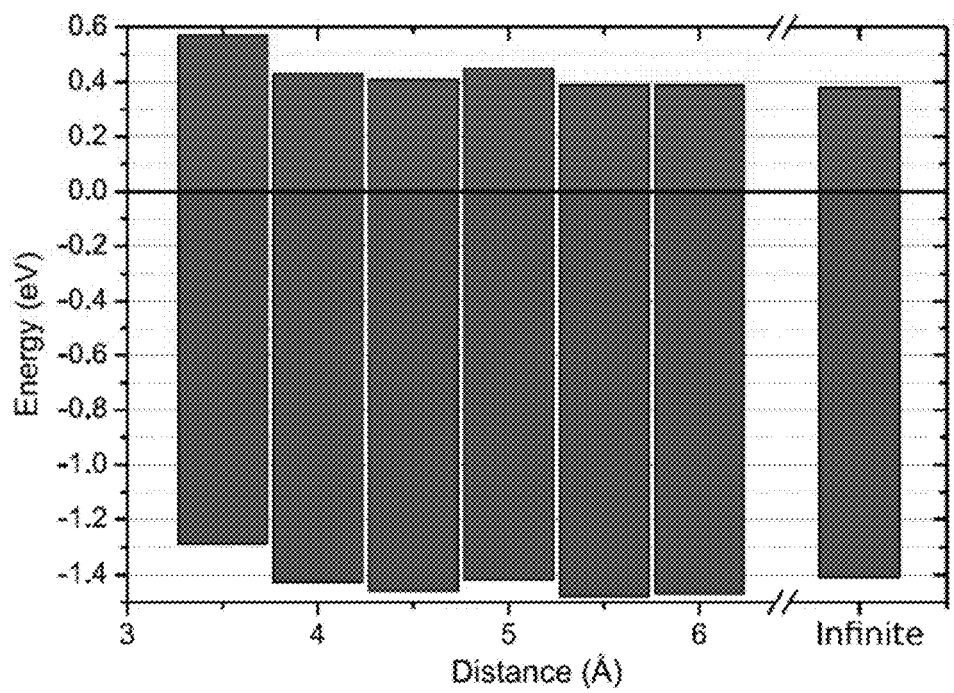
FIGS. 7A and 7B show band diagrams illustrating energy band alignment as the distance between graphene and a TMD increases.
Figure 7B:
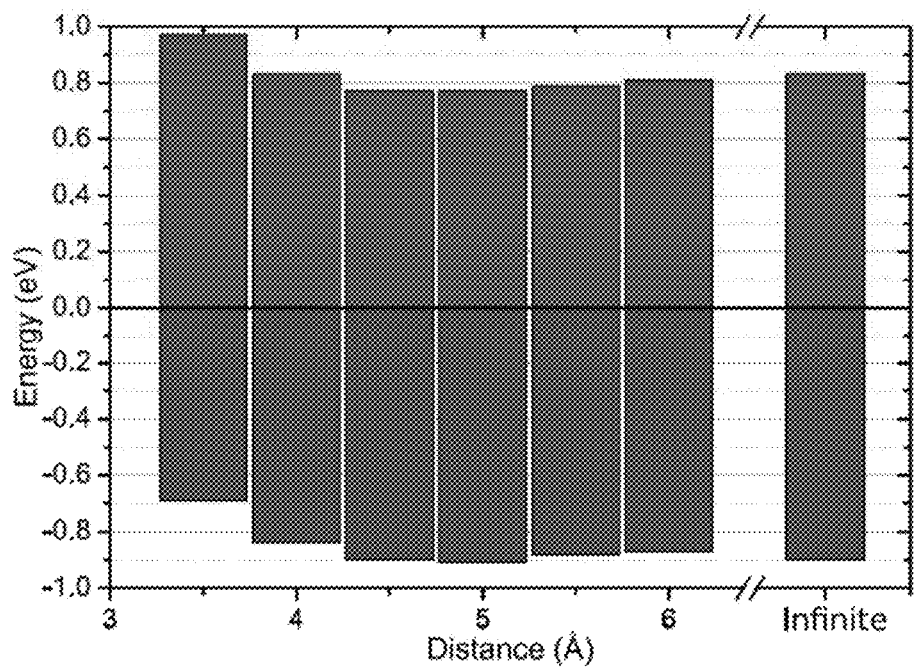

FIGS. 7A and 7B show band diagrams illustrating energy band alignment as the distance between graphene and a TMD increases. FIG. 7A represents the change of band offset for graphene and $MoS_2$; and FIG. 7B represents the change of band offset for graphene and $WSe_2$. The figures show that when a layer of graphene approaches a single layer of TMD from infinitely far to the optimum distance (3.5 Å), the band offset does not change much compared to that when metal is approaching TMD. The small change is due to the repulsion effect of wave function on the interface.

FIGS. 8A-8E show detailed band structures of the graphene and TMD layers. FIG. 8A shows the band structure of a monolayer graphene; FIG. 8B shows the band structure of a monolayer $MoS_2$; FIG. 8C shows the band structure of a unit cell (supercell) of graphene on top of $MoS_2$ with a distance of 3.5 Å; FIG. 8D shows the band structure of a unit cell (supercell) of graphene on top of WSe$_2$ with a distance of 3.5 Å; and FIG. 8E shows the band structure of graphene on top of ZrS$_2$ with a distance of 3.5 Å. Although in contact, there is little difference between the coupled system's band structure (FIG. 8C) and the simple overlapping of the bands of two isolated mono layers (FIGS. 8A and 8B). The figures show that neither the work function of graphene nor the $E_v$ and $E_c$ of MoS$_2$ is changed much before (FIG. 8A) and after (FIG. 8C) contact. This indicates that graphene will form a Schottky contact with MoS$_2$, as has been proved by experimental works. It was a similar case for the graphene-WSe$_2$ system shown in FIG. 8D, as the work function of graphene is also between the $E_v$ and $E_c$ of TMD. In both of these cases, the work function of graphene is retained, unlike metal-TMD contact, in which the work function of metal is modified by TMD. This results in a Fermi level "unpinning", which was recently experimentally demonstrated.

The band structures shown in FIGS. 8A-8D also indicate that no gap states were formed after contact, which is different from simulation results of the metal-MoS$_2$ contact. In the absence of pinning mechanism, the band structure of the layers are fixed before and after contact, and electrons are free to tunnel from one layer to the other through a Schottky barrier. Such an ideal interface makes graphene-TMD a good candidate for barristor design, since it suggests that any modification on the Fermi level of graphene may cause little interference to TMD, resting one layer below.

Different from MoS$_2$ and WSe$_2$, the conduction band edge of ZrS$_2$ lies 1.2 eV below the Fermi level of graphene. Upon contact, as shown in FIG. 8E, electrons will tunnel through from graphene to ZrS$_2$ despite the relatively large distance and secondary bonding nature. As a result, the Fermi level of the coupled system will touch the conduction band edge of ZrS$_2$, indicating an n-type ohmic contact (see FIG. 9C).

So far it has been demonstrated that no Fermi level pinning is present within the band gap edges of TMDs, and the band alignment results in a high Schottky barrier. This observation shows that the work function of graphene is inert to contact (see FIGS. 8C-8E), which makes it possible to tune the work function of graphene on one side of it, and make ideal contact between graphene and TMD on the other side. Such tuning is proved to be achievable by electrostatic field effect and polarizing ionic liquid, however, neither of them have been proved to establish real ohmic contact between graphene and semiconductor. In this simulation, it can be seen that ion adsorption has the ability to tune the work function of graphene with a wider margin than field effect or ion liquid, so that tuned graphene can form both n-type and p-type ohmic contact with TMDs.

In the simulation examples, LiPF$_6$ electrolyte was considered for the electrolyte layer. Lithium and hexafluorophosphate group (PF$_6$) adsorption were shown to tune graphene's work function to achieve ohmic contact. Doping Li atoms onto graphene will bring electrons into the system without significant changes onto its band structure, causing its Fermi level to rise above the Dirac point. Doping of PF$_6$ has reverse effect. The relationship between Fermi level raising effect and doping concentration (in Li:C ratio) by adding one Li atom onto a graphene supercell with different sizes was explored. By extrapolating to the doping limit of Li in graphite (1:6), it is found that the Fermi level can be tuned up by as much as 1.22 eV. Due to the large size of PF$_6$ group, the maximum doping concentration of PF$_6$ cannot be comparable to that of Li; however, reaching a high doping concentration on surface (1PF$_6$:25C), the Fermi level can be tuned down by 1.66 eV.

Figure 9A:
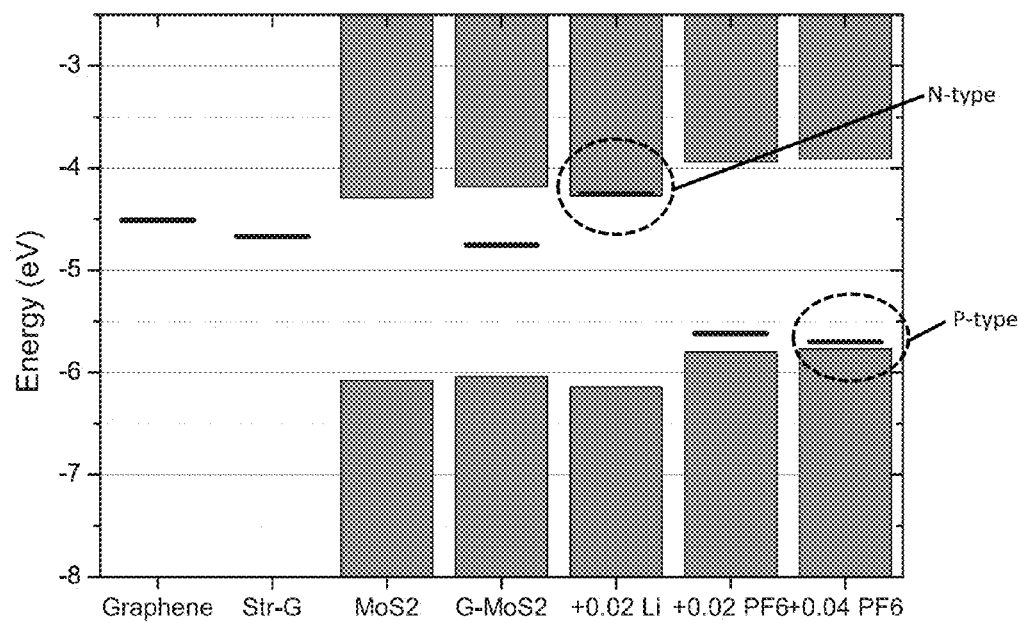
FIGS. 9A-9C show band diagrams illustrating the Fermi level of graphene and strained graphene (to match lattice constant of TMD material), and the valence and conduction band edges of the TMD and the contact systems.
Figure 9B:
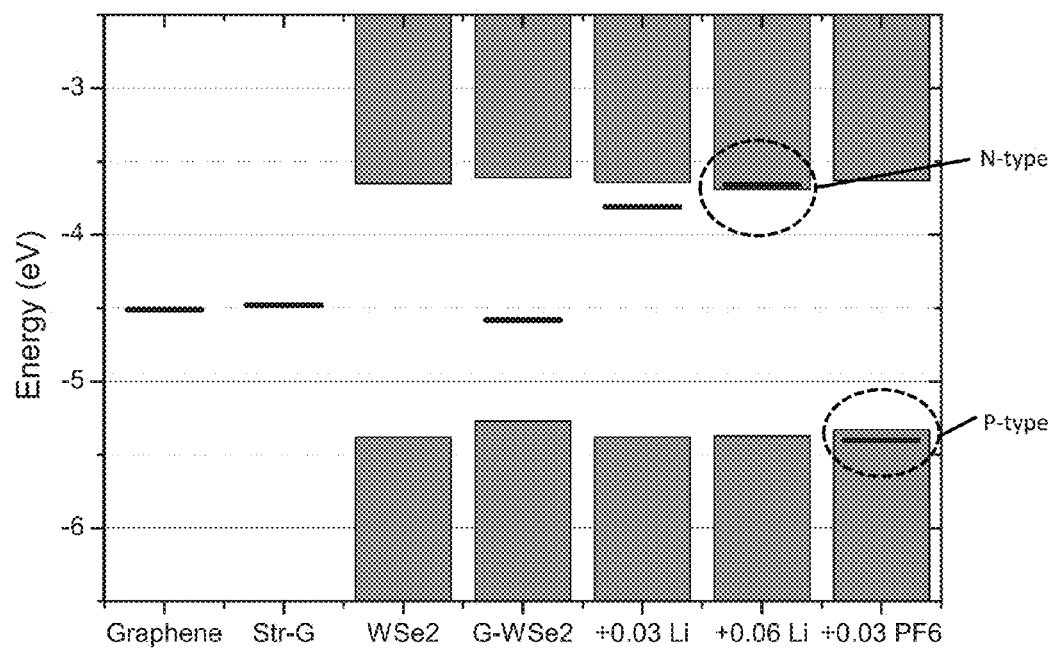
Figure 9C:
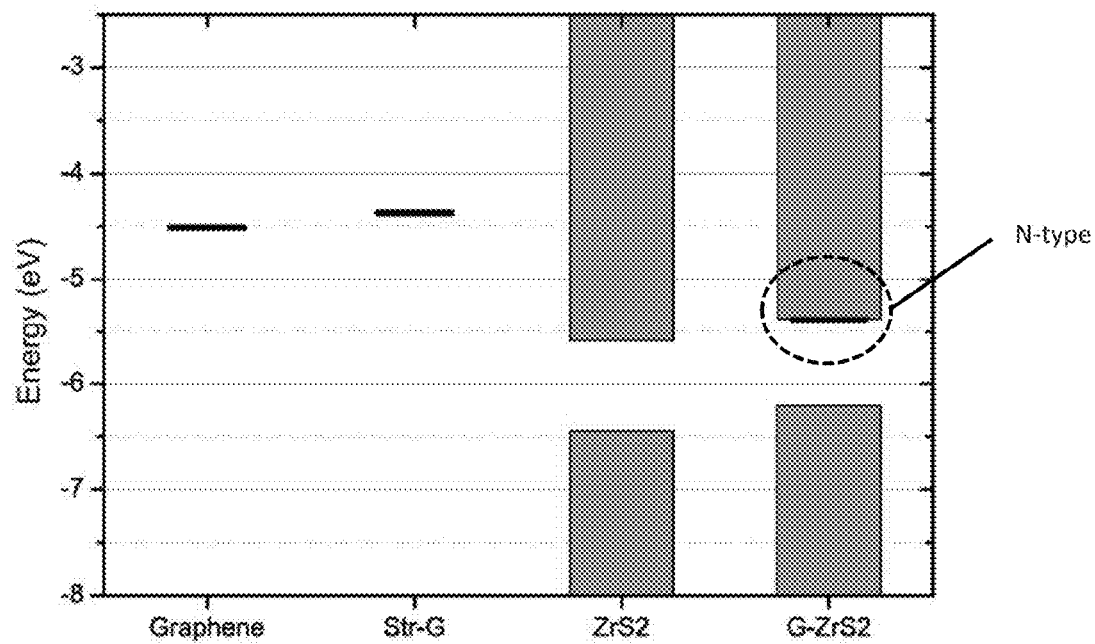

The Fermi level lies at the electrically neutral point of graphene. FIGS. 9A-9C show band diagrams illustrating the Fermi level of graphene and strained graphene (to match lattice constant of TMD material), and the valence and conduction band edges of the TMD and the contact systems; FIG. 9A shows the energy diagram for MoS$_2$ as the TMD; FIG. 9B shows the energy diagram for WSe$_2$ as the TMD; and FIG. 9C shows the energy diagram for ZrS$_2$ as the TMD. It can be seen from FIG. 9A that a ratio of 1:50 (+0.02) Li to C results in an n-type ohmic contact for graphene on MoS$_2$. A higher ratio (e.g., 1:40) will also establish an n-type ohmic contact between the TMD and the graphene. For a p-type ohmic contact, a ratio of 1:50 PF$_6$ to graphene is too low, but a ratio of at least 1:25 (+0.04) PF$_6$ to graphene is sufficient to establish a P-type ohmic contact.

In a similar manner, referring to FIG. 9B, a ratio of at least 1:32 (+0.06) Li to graphene establishes an n-type ohmic contact for graphene and WSe$_2$; and a ratio of at least 1:16 (+0.03) PF$_6$ to graphene establishes a p-type ohmic contact.

Figure 10:
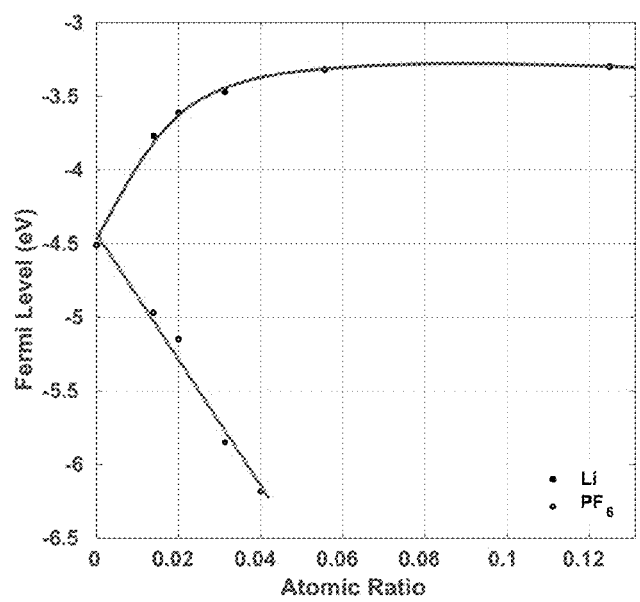
FIG. 10 shows a plot of the Fermi level of graphene as graphene is doped with different concentrations of Li atom or $PF_6$ group.

FIG. 10 shows a plot of the Fermi level of graphene as graphene is doped with different concentrations of Li atom or PF$_6$ group. Such a wide range of work function from 3.30 eV to 6.18 eV, as is shown in FIG. 10, enables graphene to have ohmic contact with a wide range of semiconductors including TMD monolayers, in the same manner as undoped graphene has ohmic contact with ZrS$_2$ as previously demonstrated.

Figure 11A:
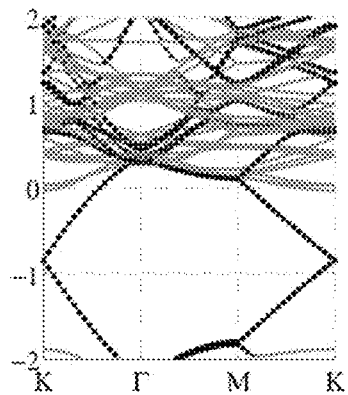
FIGS. 11A-11D show detailed band structures of a combined system of doped graphene on TMD.
Figure 11B:
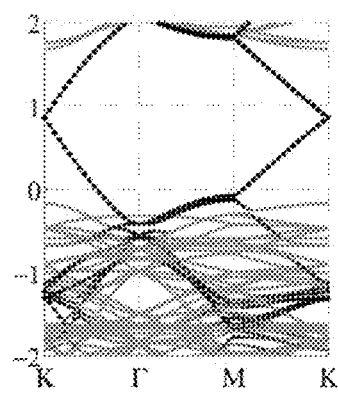
Figure 11C:
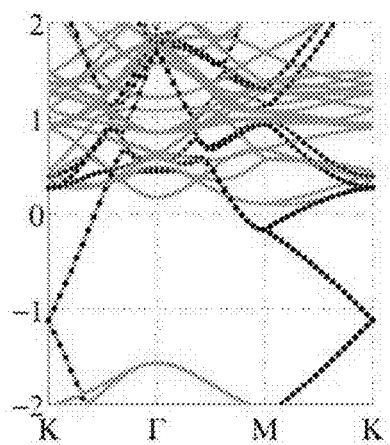
Figure 11D:
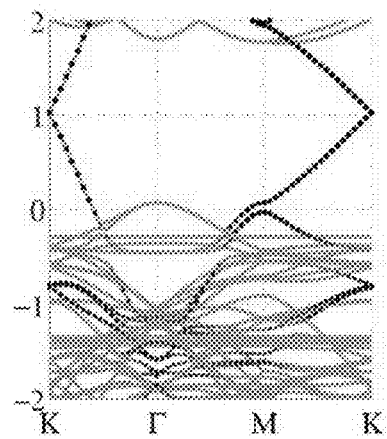

FIGS. 11A-11D show detailed band structures of a combined system of doped graphene on TMD. FIG. 11A shows the band structure of Li-doped graphene on MoS$_2$; FIG. 11B shows the band structure of PF$_6$-doped graphene on MoS$_2$; FIG. 11C show the band structure of Li-doped graphene on WSe$_2$; and FIG. 11D shows the band structure of and PF$_6$-doped graphene on WSe$_2$ When in ohmic contact with TMD, the Fermi level of graphene with ion adsorption will be fixed to the edge of the conduction or valence band of TMD before reaching the extrapolated tuning limit of Li or PF$_6$ on graphene.

FIG. 11A shows the band structure of Li-doped graphene on single layer MoS$_2$ and FIG. 11B shows the band structure of PF$_6$-doped graphene on single layer MoS$_2$. It is shown that by adding Li atoms at a Li:C ratio of 0.02, an n-type ohmic contact is established (see FIG. 9A). Doping the PF$_6$ group with an appropriate concentration (PF$_6$:C ratio being 0.04) will enable the layers to have p-type ohmic contact (see FIG. 9A). Lower doping concentration (1 PF$_6$ per 50 C atoms) can still shift the Fermi level, but not enough to reach the valence band of MoS$_2$, leaving a Schottky barrier of 0.18 eV, as indicated in FIG. 9A (at the bar labeled as +0.02 PF6). Due to charge transfer between graphene and TMD when the Schottky barrier gets small enough, states of TMD will also be affected by ions, but with a smaller margin. Changing to the same direction with different margin results in a Fermi level closer to band edge of TMD, and when overlapping with the band edge of TMD, ohmic contact is established.

Similarly, FIGS. 9B and 11C show that doping at a concentration of 1 Li per 16 C atoms will enable graphene and WSe$_2$ to establish have n-type ohmic contact; and FIGS. 9B and 11D show that doping at 1 PF$_6$ group per 32 C atoms is able to realize p-type ohmic contact between graphene and WSe$_2$. The tuning mechanism is the same with graphene-MoS$_2$ contact.

As can be seen in the simulations, doping Li$^+$ atoms onto graphene will bring electrons into the system without significant changes to graphene's band structure. In addition, doping using PF$_6$$_-$ ions has the reverse effect. When in ohmic contact with TMD, the Fermi level of graphene with ion adsorption will be fixed to the edge of the conduction or valence band of TMD before reaching the extrapolated tuning limit of $Li^+$ or $PF_6^-$ on graphene. Adding $Li^+$ atoms establishes an n-type ohmic contact and doping $PF_6^-$ enables the layers to have p-type ohmic contact.

By using graphene instead of metal in the ionic barristor design, no gap states form after contact with the TMD layer. In the absence of the pinning mechanism, the band structures of the layers are fixed before and after contact and electrons are free to tunnel from one layer to the other through a Schottky barrier. This ideal graphene-TMD interface enables a high quality barristor design since it suggests that any modification on the Fermi level of graphene may cause little interference with to the TMD layer below. Indeed, research has demonstrated that no Fermi level pinning is present within the band gap edges of TMDs, and the band alignment results in a high Schottky barrier. In an ionic barristor, the work function of graphene is dynamically tuned, and switching on and off is realized by building and breaking ohmic contact with the TMD.

It should be understood that the examples and embodiments described herein are for illustrative purposes only and that various modifications or changes in light thereof will be suggested to persons skilled in the art and are to be included within the spirit and purview of this application.

What is claimed is:

1. A device comprising:
   a transition-metal dichalcogenide (TMD) layer;
   a graphene layer on the TMD layer and extending over an isolation layer laterally adjacent to the TMD layer;
   an electrolyte layer on the graphene layer; and
   a source gate contact on the electrolyte layer.

2. The device of claim 1, further comprising a source contact on the graphene layer.

3. The device of claim 2, further comprising:
   a dielectric on the TMD layer to a side of the graphene layer;
   a gate contact on the dielectric;
   a drain contact on the TMD layer at a side of the dielectric opposite of the graphene layer.

4. The device of claim 1, further comprising a drain contact on the TMD layer.

5. The device of claim 1, wherein the electrolyte comprises Li.

6. The device of claim 1, wherein the electrolyte comprises $PF_6$.

7. The device of claim 1, wherein the TMD layer comprises $MoS_2$.

8. The device of claim 1, wherein the TMD layer comprises $WSe_2$.

9. The device of claim 1, wherein the TMD layer comprises $ZrS_2$.

10. The device of claim 1, wherein the TMD layer is on an insulating substrate.

11. The device of claim 1, wherein the TMD layer is on a semiconductor or semiconducting substrate.

12. The device of claim 1, further comprising a voltage source coupled to the source gate for generating an electric field, whereby an n-type or p-type ohmic contact is established by adsorption of ions from the electrolyte on the graphene.

13. The device of claim 12, wherein the TMD layer comprises $MoS_2$ and the electrolyte comprises $PF_6$ ions and Li ions,
    wherein for the p-type ohmic contact, the voltage source is configured to apply a voltage to the source gate such that the $PF_6$ ions from the electrolyte are adsorbed on the graphene with a ratio of $PF_6$ to graphene of at least 1:25; and
    wherein for the n-type ohmic contact, the voltage source is configured to apply a voltage to the source gate such that the Li ions from the electrolyte are adsorbed on the graphene with a ratio of Li to graphene of at least 1:50.

14. The device of claim 12, wherein the TMD layer comprises $WSe_2$, the electrolyte comprises $PF_6$ ions and Li ions,
    wherein for the p-type ohmic contact, the voltage source is configured to apply a voltage to the source gate such that the $PF_6$ ions from the electrolyte are adsorbed on the graphene with a ratio of $PF_6$ to graphene of at least 1:32; and
    wherein for the n-type ohmic contact, the voltage source is configured to apply a voltage to the source gate such that the Li ions from the electrolyte are adsorbed on the graphene with a ratio of Li to graphene of at least 1:16.

15. A method of operating a device comprising a transition-metal dichalcogenide (TMD) layer; a graphene layer on the TMD layer and extending over an isolation layer adjacent to the TMD layer; an electrolyte layer on the graphene layer; a drain contact on the TMD layer; a source contact on a portion of the graphene layer extending over the isolation layer; and a source gate contact on the electrolyte layer, the method comprising:
    applying a switching voltage to the source gate contact to establish ion accumulation in the electrolyte at the graphene layer while a source-drain voltage is applied across the source contact and the drain contact which allows current to flow; and
    during the current flow through the TMD layer between the source contact and the drain contact, applying a maintenance voltage that has a lower magnitude than the switching voltage to maintain a concentration of ions near the graphene layer.

16. The method of claim 15, further comprising:
    turning the device off by applying an off-switching voltage that is about a same magnitude and opposite in polarity to the switching voltage.

17. The method of claim 15, wherein the TMD layer comprises $MoS_2$ and the electrolyte comprises $PF_6$ ions and Li ions,
    wherein the switching voltage has a magnitude and polarity such that the $PF_6$ ions adsorb on the graphene with a ratio of $PF_6$ to graphene of at least 1:25.

18. The method of claim 15, wherein the TMD layer comprises $MoS_2$ and the electrolyte comprises $PF_6$ ions and Li ions,
    wherein the switching voltage has a magnitude and polarity such that the Li ions adsorb on the graphene with a ratio of $PF_6$ to graphene of at least 1:50.

19. The method of claim 15, wherein the TMD layer comprises $WSe_2$ and the electrolyte comprises $PF_6$ ions and Li ions,
    wherein the switching voltage has a magnitude and polarity such that the $PF_6$ ions adsorb on the graphene with a ratio of $PF_6$ to graphene of at least 1:32.

20. The method of claim 15, wherein the TMD layer comprises $WSe_2$ and the electrolyte comprises $PF_6$ ions and Li ions,
    wherein the switching voltage has a magnitude and polarity such that the Li ions adsorb on the graphene with a ratio of Li to graphene of at least 1:16.

* * * * *